United States Patent [19]

Tanaka et al.

[11] Patent Number: 4,634,902

[45] Date of Patent: Jan. 6, 1987

[54] CIRCUIT ARRANGEMENT CAPABLE OF ADJUSTING A THRESHOLD LEVEL OF A DIFFERENTIAL TRANSISTOR CIRCUIT

[75] Inventors: Kouichi Tanaka; Takeshi Kuwajima; Kiyoshi Amazawa, all of Tokyo, Japan

[73] Assignee: NEC Corporation; Clarion Co., Ltd., both of Japan

[21] Appl. No.: 552,518

[22] Filed: Nov. 16, 1983

[30] Foreign Application Priority Data

Nov. 17, 1982 [JP] Japan .................................. 57-201725
Nov. 17, 1982 [JP] Japan .................................. 57-201726

[51] Int. Cl.$^4$ ........................ H03K 5/153; H03K 5/08
[52] U.S. Cl. .................................... 307/542; 307/362; 307/573; 307/491; 307/296 R
[58] Field of Search ............... 307/354, 355, 356, 358, 307/359, 362, 542, 543, 573, 491, 296 R; 328/162

[56] References Cited

U.S. PATENT DOCUMENTS

| | | | |
|---|---|---|---|
| 4,151,471 | 4/1979 | Packard et al. | 328/165 |
| 4,375,099 | 2/1983 | Waters et al. | 307/358 |
| 4,384,219 | 5/1983 | Davis | 307/354 |
| 4,390,799 | 6/1983 | Schmoock | 307/362 |
| 4,491,743 | 1/1985 | Smith | 307/362 |

Primary Examiner—John Zazworsky
Attorney, Agent, or Firm—Sughrue, Mion, Zinn, Macpeak, and Seas

[57] ABSTRACT

In a circuit arrangement comprising a differential transistor circuit which has a threshold level and is operable in response to an input signal level and a reference signal level for producing an output signal, a resistor circuit is provided for changing the reference level. The resistor circuit comprises a resistor (30) for supplying the differential transistor circuit with the reference level and a modifying circuit coupled to the resistor for modifying the reference level by changing a current flowing through the resistor. Consequently, the threshold level can be voluntarily adjusted.

11 Claims, 8 Drawing Figures

CIRCUIT ARRANGEMENT CAPABLE OF ADJUSTING A THRESHOLD LEVEL OF A DIFFERENTIAL TRANSISTOR CIRCUIT

BACKGROUND OF THE INVENTION

This invention relates to a circuit arrangement including a differential transistor circuit.

As a typical one of such circuit arrangements, a comparator is known wherein an output signal is produced when an input signal level exceeds a predetermined threshold voltage. In this comparator, the threshold voltage is determined by a difference between base voltages of both transistors of the differential transistor circuit. The threshold voltage is kept constant in the conventional comparator. However, it has been found out that such a constant threshold voltage often gives rise to inconvenience in practical use.

SUMMARY OF THE INVENTION

It is an object of this invention to provide a circuit arrangement comprising a differential transistor circuit wherein the threshold voltage can be easily adjusted.

A circuit arrangement to which this invention is applicable is responsive to an input signal having an input signal level for producing an output signal. The circuit arrangement comprises a differential transistor circuit responsive to the input signal level and a reference signal of a reference level for producing the output signal and circuit means for supplying the differential transistor circuit with the reference signal. The circuit means includes a resistor for providing the reference level by a current flowing therethrough. According to this invention, the circuit means comprises modifying means coupled to the resistor for modifying the reference level by changing the current.

Figure 1:
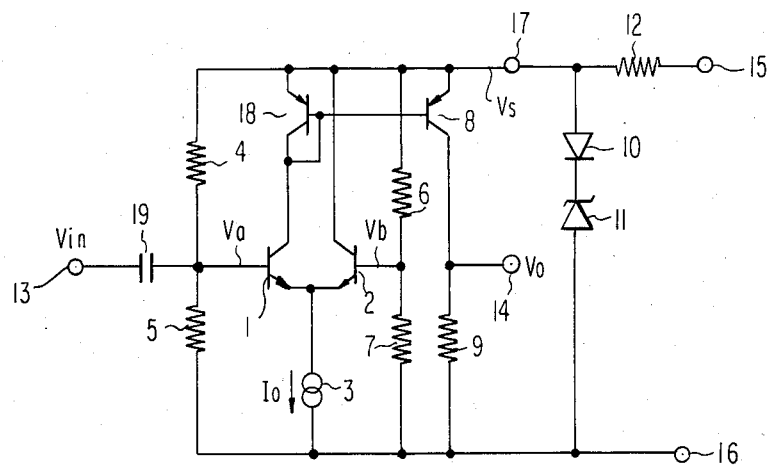
FIG. 1 is a circuit diagram of a conventional comparator.

DESCRIPTION OF THE PREFERRED EMBODIMENTS:

Referring to FIG. 1, description will be made of a conventional comparator in order to facilitate an understanding of this invention. The circuit has an input terminal 13 for an input signal and an output terminal 14 for an output signal. A differential transistor circuit is composed of first and second transistors 1 and 2 having emitters connected to a point of connection and thence to a constant current source 3. The first transistor 1 has a base connected to a point of connection between bias resistors 4 and 5 of resistances, which will be denoted by $R_4$ and $R_5$ by the use of suffixes of the reference numerals of the respective resistors 4 and 5. The second transistor 2 has a base connected to a point of connection between bias resistors 6 and 7 of resistances $R_6$ and $R_7$. An output circuit comprises transistors 18 and 8 and a resistor 9. A collector of the transistor 18 is connected to a collector of the transistor 1. A voltage stabilizing circuit comprises a diode 10, a zener diode 11, and a resistor 12 and is for stabilizing an unstabilized voltage supplied from an unstabiized power terminal 15 to the differential transistor circuit with a stabilized voltage $V_s$ through a stabilized power terminal 17. The circuit has an earth terminal 16.

In this comparator, the second transistor 2 is supplied with a base voltage $V_b$ higher than a base voltage $V_a$ of the first transistor 1. The base voltages $V_a$ and $V_b$ are given by:

$$V_a = R_5 \cdot V_s / (R_4 + R_5) \tag{1}$$

and $$V_b = R_7 \cdot V_s / (R_6 + R_7) \tag{2}$$

respectively.

When the input signal of an input voltage $V_{in}$ is not supplied to the input terminal 13, a threshold voltage $V_{th}$ of the differential transistor circuitis given by:

$$V_{th} = V_b - V_a. \tag{3}$$

Figure 2:
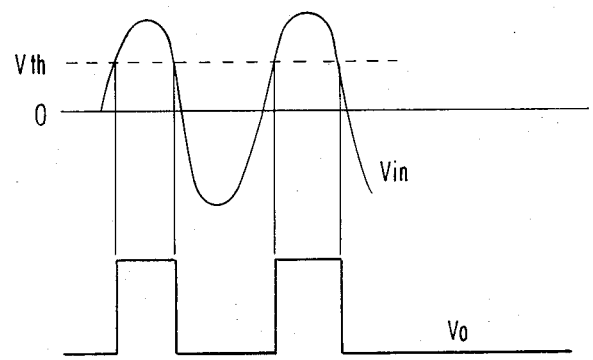
FIG. 2 shows wave forms for use in describing operation of the comparator illustrated in FIG. 1.

As depicted in FIG. 2, an output voltage $V_o$ is produced from the output terminal 14, if the input voltage $V_{in}$ exceeds the threshold voltage $V_{th}$.

As obvious from Equations (1), (2), and (3), the threshold voltage $V_{th}$ is fixedly determined in this conventional comparator. If this comparator is composed of a semiconductor integrated circuit, the threshold voltage $V_{th}$ cannot be varied. Therefore, the illustrated circuit is not applicable to a wide variety of uses.

The threshold voltage of the comparator shown in FIG. 1 may be adjusted by using a variable resistor in place of the fixed resistor 7, for example. The variable resistor cannot be fabricated within the semiconductor integrated circuit device, and therefore, it should be connected to the base of the transistor 2 as an external element. The temperature characteristics in the resistance value between the semiconductor resistor 6 and the external resistor 7 are quite different from each other. As a result, the base voltage $B_b$ of the transistor 2 is changed in accordance with the variation in the ambient temperature. In other words, the threshold voltage $V_{th}$ has a temperature dependence. Further, the base of the transistor 2 should be connected to an external terminal provided in the semiconductor integrated device, to which the variable resistor as the resistor 7 is connected. For this reason, the transistor 2 may directly receive a noise or a hum at its base through the external terminal.

Figure 3:
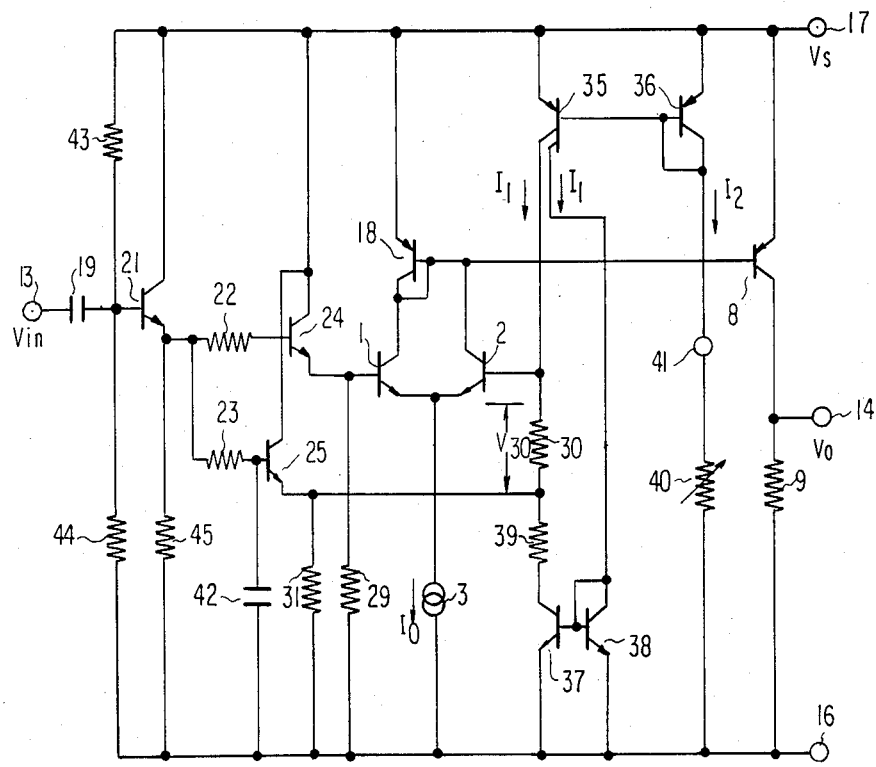
FIG. 3 is a circuit diagram of a circuit arrangement according to a first embodiment of this invention.

Referring to FIG. 3, a circuit arrangement according to a first embodiment of this invention is for use as the comparator. The circuit arrangement has the input terminal 13 and the output terminal 14, the earth terminal 16 and the stabilized power terminal 17, the differential transistor circuit composed of the first and the second transistors 1 and 2, the constant current source 3, the output circuit comprising the transistors 18 and 8, and the resistor 9, like the conventional comparator illustrated in FIG. 1. An input circuit comprising capacitors 19 and 42, transistors 21, 24, and 25, and resistors 22, 23, 29, 31, 43, 44, and 45, is coupled to the differential transistor circuit. The transistor 21 receives the base bias voltage determined by the resistors 43 and 44. An emitter of the transistor 21 is connected to a base of the transistors 24 and 25 through the resistors 22 and 23, respectively. Collectors of the transistors 24 and 25 are connected to a point of connection and thence to the stabilized power terminal 17. A base of the transistor 1 is connected to an emitter of transistor 24 and thence to the earth terminal 16 through the resistor 29. One end of a resistor 30 is connected to a base of the transistor 2 so as to determine a reference signal of a reference level by a current $I_1$ flowing therethrough. Another end of the resistor 30 is connected to an emitter of the transistor 25 and to the earth terminal 16 through the resistor 31. A current supplying circuit comprising transistors 35, 36, 37, and 38 and a resistor 39, is coupled to the resistor 30. The transistor 35 has two collectors of a common characteristic which are designed so that the currents flowing through the two collectors are equal to each other and to the current $I_1$. The transistor 36 has a diode connection wherein a base and a collector thereof are connected to each other. A variable resistor 40 of resistance $R_{40}$ is connected between a controlling terminal 41 and the earth terminal 16 so as to control the current $I_1$. The resistor 40 is usually mounted on a position spaced from the comparator through the controlling terminal 41 and the earth terminal 16. In this current supplying circuit, a ratio of the current $I_2$ to current $I_1$ is set to be equal to 1 to m. In operation, the current $I_2$ is given by:

$$I_2 = (V_s - V_{be36})/R_{40}, \quad (4)$$

where $V_{be36}$ represents the base-emitter forward voltage of the transistor 36. It is possible to neglect the base current flowing through the transistor 2. When the current $I_1$ flows through the resistor 30, a voltage $V_{30}$ appears across the resistor 30 and is given by:

$$V_{30} = I_1 \cdot R_{30} = m \cdot I_2 \cdot R_{30} = m \cdot (V_s - V_{be36}) \cdot R_{30}/R_{40}. \quad (5)$$

If the resistors 22 and 29 and the transistor 24 are identical with the resistors 23 and 31 and the transistor 25, respectively, the voltage between the base and the emitter of the transistor 24 becomes equal to that between the base and the emitter of the transistor 25. In other words, the transistor 24 provides the same emitter potential as the transistor 25. The input signal $V_{in}$ is supplied to the transistor 1, but it does not appear at the emitter of the transistor 25 due to the capacitor 42. This means that a threshold voltage $V_{th}'$ of the differential transistor circuit becomes equal to the voltage $V_{30}$ across the resistor 30. Therefore, the threshold voltage $V_{th}'$ is given by:

$$V_{th}' = V_{30}. \quad (6)$$

As is obvious from Equations (5) and (6), the threshold voltage $V_{th}'$ can be voluntarily adjusted to a desired voltage by changing the resistance of the register 40. The resistor 40 is connected to the terminal 41 which is connected to the comparator composed of the transistors 1 and 2 through a current mirror of the transistors 35 and 36. Accordingly, the transistor 2 is free from noise or a hum supplied through the terminal 41. Further, the threshold voltage $V_{th}'$ of this circuit is determined by the resistance value of the resistor 30 and the current $I_1$ flowing therethrough. The current $I_1$ is determined by the stabilized voltage $V_s$, the base-emitter forward voltage $V_{be36}$ of the transistor 36, and the resistance value of the resistor 40. Therefore, it is possible for the threshold voltage $V_{th}'$ to be made independent of variation in the ambient temperature by regulating the temperature characteristics of the resistor 30 and the current $I_1$. Furthermore, the transistor 25 supplies substantially no current to the transistor 37, since the resistors 30 and 39 are connected in series between the collectors of the transistors 35 and 37 and the current flowing through the resistor 30 is substantially equal to that flowing through the transistor 37. The transistor 25 is provided for the purpose of supplying a DC potential to one end of the resistor 30. Accordingly, the threshold voltage $V_{30}$ can be adjusted independently of the base bias voltages of the transistors 21, 24 and 25 by controlling the current $I_2$, i.e. the current $I_1$. A voltage drop across the resistor 39 may be used as a threshold voltage or a reference voltage for another circuit.

Figure 4:
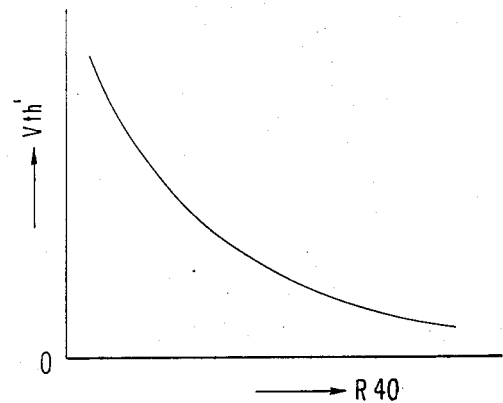
FIG. 4 is a resistance versus threshold voltage characteristic of a differential transistor circuit used in the circuit arrangement depicted in FIG. 3.

Referring to FIG. 4, the threshold voltage $V_{th}'$ decreases as the resistance $R_{40}$ of the resistor 40 increases.

As described above, the illustrated comparator is capable of voluntarily varying the threshold voltage and is therefore suitable for various uses. In addition, the comparator can be manufactured by the use of a semiconductor integration technique.

Figure 5:
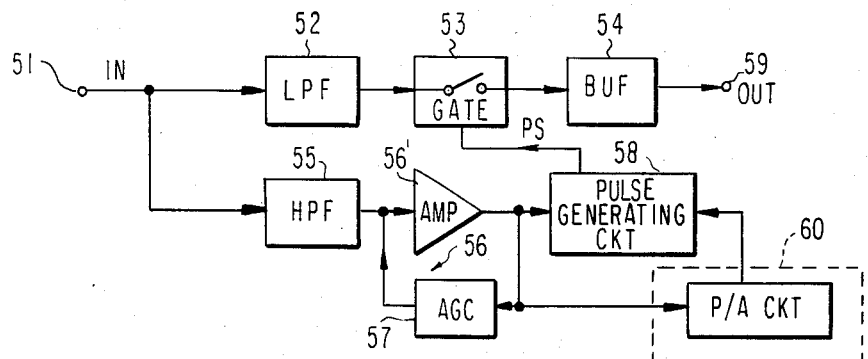
FIG. 5 is a block diagram of a noise reducing unit which comprises a circuit arrangement including a differential transistor circuit.

Referring to FIG. 5, description will be made of a noise reducing unit for use in an FM broadcasting receiver. The noise reducing unit comprises a circuit arrangement according to a second embodiment of this invention, as will become clear. The unit has an input terminal 51 for an input signal IN accompanied by pulse noise and an output terminal 59 for an output signal OUT free from the pulse noise. The unit comprises a low-pass filter 52 having a predetermined pass band for extracting a low frequency component from the input signal IN, a gate circuit 53 for interrupting the input signal IN, a buffer 54 of a high input impedance for keeping the input signal level during interruption of the input signal, a high-pass filter 55 having a predetermined pass band for extracting a high frequency component, namely, the pulse noise from the input signal IN. The unit comprises an AGC (automatic gain control) circuit 56 comprising an amplifier 56' and an automatic gain controller 57 and a pulse generating circuit 58 for supplying the gate circuit 53 with a pulse signal PS when an output signal level of the AGC circuit 56 exceeds a predetermined level.

The above-mentioned structure is similar to that of a conventional noise reducing unit included in a radio receiver. Let consideration be directed to such a radio receiver loaded on an automobile. Such a radio receiver is inevitably subjected to the influence of noise resulting from an ignition device and a wiper device on the automobile and from signal devices, such as traffic signals and warning lights on a road. The radio receiver is also subjected to the influence of noise resulting from electrical field strength or intensity. However, the above-mentioned conventional noise reducing unit could not fully respond to variation in the electrical field strength.

According to the inventors' experimental studies, it has been found that there is provided a noise reducing unit having an improved response to the variation in the electrical field strength by adjusting a ratio of the predetermined voltage (threshold voltage) of the pulse generating circuit 58 to an output voltage of the AGC circuit 56 in accordance with the electrical field strength. The above-mentioned ratio may be called a pulse level to automatic gain control level ratio and therefore will be abbreviated to as a P/A ratio. In accordance with a decrease in the P/A ratio, the pulse generating circuit 58 supplies the pulse signal PS to the gate circuit 53 in response to a smaller level of the output signal from the AGC circuit 56.

Under the circumstances, the illustrated noise reducing unit further comprises a noise control circuit 60 for automatically changing the P/A ratio. The noise control circuit 60 may therefore be called a P/A circuit. The P/A circuit 60 serves to change the P/A ratio from one to another with reference to a predetermined voltage in a manner to later be described in conjunction with FIG. 7. It suffices to say that the P/A circuit 60 is operable as a part of the circuit arrangement, as will later be described.

Figure 6:
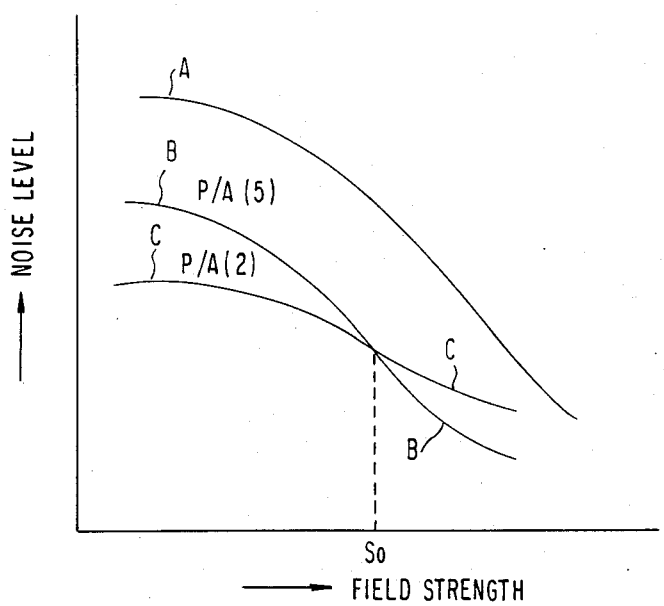
FIG. 6 is a field strength versus noise level characteristic of the noise reducing unit depicted in FIG. 5.

Referring to FIG. 6, a curve A shows a characteristic of a receiver having no noise reducing unit. Another curve B shows a characteristic in a state wherein the P/A ratio is 5. Still another curve C shows a characteristic in a state wherein the P/A ratio is 2. As obvious from FIG. 6, the noise level becomes smaller with a decrease in the P/A ratio from 5 to 2 in a weak field strength below a critical strength $S_0$. On the contrary, the noise level becomes smaller with an increase in the P/A ratio from 2 to 5 in a strong field strength over the critical strength $S_0$. This is because a noise component other than the pulse noise caused by the ignition device, etc., which accompanies the input signal IN, has a level which becomes large in accordance with the decrease in the electrical field strength. Accordingly, if the P/A ratio is suitably changed in response to the field strength by the P/A circuit 60, the noise level can be fully reduced.

As mentioned above, it is important in such a noise reducing unit that the P/A ratio can suitably be adjusted to reduce the various noises.

The operation of the noise reducing unit will now be analysed. If the input signal IN introduced into the input terminal 51 is not accompanied by a noise signal or has very small level noise, the input signal IN is produced from the output terminal 59 through the low-pass filter 52, the gate circuit 53 and the buffer 54. However, when the input singal IN is accompanied by pulse noise, the pulse noise is introduced into the AGC circuit 56 through the high-pass filter 55. The pulse generating circuit 58 generates the pulse signal PS and delivers it to the gate circuit 53 when the output voltage of the AGC circuit 56 exceeds a threshold voltage of the pulse generating circuit 58. The gate circuit 53 is disabled by the pulse signal PS during passage of the pulse noise through the gate circuit 53. Therefore, the pulse noise does not reach the output terminal 59.

The P/A circuit 60 controls the pulse generating circuit 58 in response to the field strength. More specifically, the P/A circuit 60 reduces the threshold voltage of the pulse generating circuit 58 and makes the threshold voltage approach the output voltage of the AGC circuit 56 in weak field strength. On the contrary, the P/A circuit 60 raises the threshold voltage of the pulse generating circuit 58 to a level higher than the output voltage of the AGC circuit. Accordingly, the noise level of the noise reducing unit is determined by the characteristic of the curve C (FIG. 6) in the weak field (strength below the critical strength $S_0$) and by the characteristic of the curve B in the strong field (strength over the critical strength $S_0$,) respectively.

Figure 7:
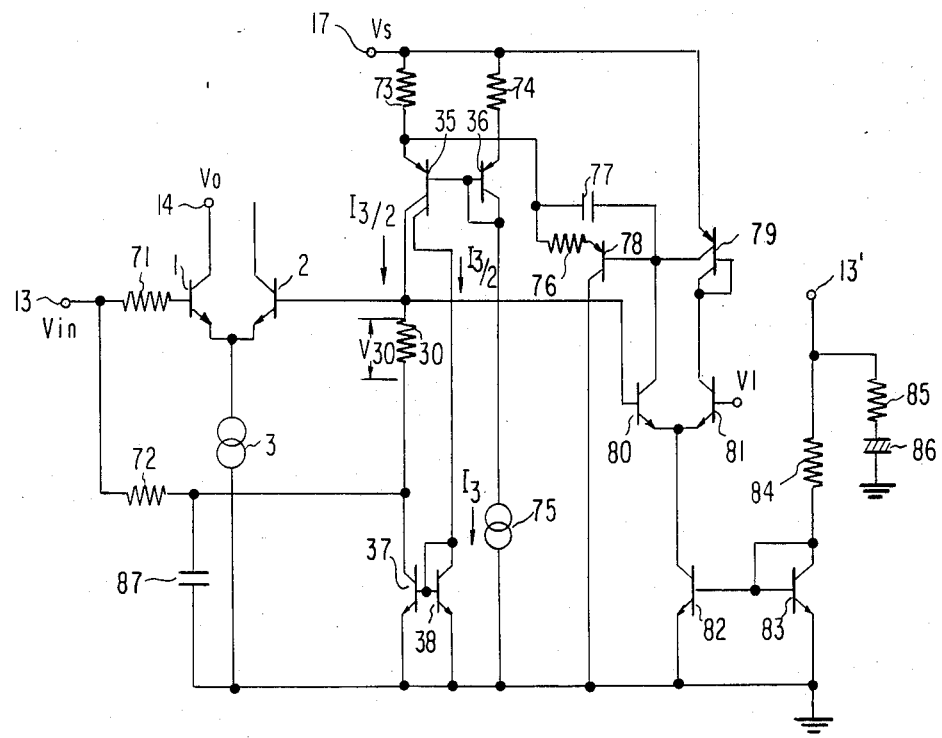
FIG. 7 is a circuit diagram of a circuit arrangement according to a second embodiment of this invention.

Referring to FIG. 7, a circuit arrangement according to a second embodiment of this invention is used for providing the pulse generating circuit 58 and the P/A circuit 60 illustrated in FIG. 5. The circuit arrangement has the first input terminal 13 and the output terminal 14, the differential transistor circuit comprising the first and the second transistors 1 and 2 and the constant current source 3, the resistor 30 for providing the reference signal with the differential transistor circuit by the current $I_3/2$ flowing therethrough, the current supplying circuit comprising the transistors 35, 36, 37 and 38, and a resistors 73 and 74, and a constant current source 75 of the current $I_3$, like the comparator illustrated in FIG. 3.

The input signal $V_{in}$ applied to the terminal 13 comprises an AC voltage component and a DC voltage component. This input signal $V_{in}$ is supplied to the transistor 1 through a resistor 71. However, only the DC voltage component of the input signal $V_{in}$ appears at a connection point between a resistor 72 and a capacitor 87. This is because the AC voltages component of the input signal is bypassed to the earth due to the capacitor 87.

A current controlling circuit comprising transistors 78, 79, 80, 81, 82, and 83, resistors 76, 84, and 85, and capacitors 77 and 86, is coupled to the current supplying circuit for controlling the current $I_3/2$. A time constant circuit is composed of the resistor 85 and the capacitor 86 for averaging the voltage of input signal introduced into a second input terminal 13'. In this current controlling circuit, the transistor 83 is rendered conductive when an average voltage of the collector thereof exceeds a predetermined voltage $V_{x1}$ determined by the base-emitter voltage of the transistor 83. Accordingly, the transistors 78, 79, 80, 81, and 82 are also rendered conductive. Since the transistor 79 is a current mirror type transistor, the transistor 80 branches the emitter current of the transistor 35 through the transistor 78 so as to equalize the base voltage of transistor 80 and the reference base voltage $V_1$ of the transistor 81. In other words, the current flowing through the resistor 30 is so reduced that the base voltage of the transistor 80 (i.e. transistor 2) and the reference voltage $V_1$ become equal to each other, when the transistor 83 is turned on. The voltage $V_{x1}$ is determined so as to be equivalent to the critical strength $S_0$. In this circuit arrangement, the differential transistor circuit acts as the pulse generating circuit 58 illustrated in FIG. 5. The current supplying circuit and the current controlling circuit act as the P/A circuit 60 illustrated in FIG. 5. The input signal, namely, an output signal of the AGC circuit 56, is introduced into the input terminals 13 and 13'.

The output signal of the AGC circuit 56 represents a noise signal accompanying the input signal IN supplied to the terminal 51 (FIG. 5). The noise signal accompanying the input signal IN comprises a first kind of noise component caused by the ignition device, wiper device, or signal devices provided in the automobile and a second kind of noise component caused by the electrical field strength or intensity. The first kind of noise component corresponds to the pulse noise. The capacitor 86 (FIG. 7) is charged by the output signal of the AGC circuit 56, that is, the noise signal. Since the first kind of noise component (i.e. the pulse noise) is interruptedly generated at random, it cannot charge the capacitor 86 at a level such that the transistor 83 is turned on. On the other hand, the second kind of noise component has a level which is increased as the electrical field strength decreases. When the electrical field strength becomes equal to or lower than the critical strength $S_0$ (FIG. 6), the capacitor 86 is charged by the second kind of noise component to turn the transistor 83 on. Consequently, the current flowing through the resistor 30 is changed to vary the threshold voltage (i.e. the P/A ratio), as described hereinbefore.

In operation, it will be assumed that the average voltage of the input signal is introduced into the input terminal 13' under the pretermined voltage $V_{x1}$. The transistors 78, 79, 80, 81, 82, and 83 are cut-off. Accordingly, a differential of the base voltages of the transistors 1 and 2 is a voltage $V_{30off}$ which appears across the resistor 30 and is determined by the current $I_3$ by means of the constant current source 75. The voltage $V_{30off}$ is given by:

$$V_{30off} = (V_{inDC} + I_3 \cdot R_{30}/2) - V_{inDC} = I_3 \cdot R_{30}/2, \quad (7)$$

where $V_{inDC}$ represents a DC voltage of the input signal $V_{in}$.

On the contrary, if the average voltage of the input signal introduced into the input terminal 13' exceeds the voltage $V_{x1}$ due to the fact that the field strength becomes equal to the critical strength $S_0$; the transistors 78, 79, 80, 81, 82, and 83 are rendered conductive. The transistor 80 branches the emitter-current of the transistor 35 through the transistor 78 so that a voltage $V_{30on}$ appears across the resistor 30. The reference voltage $V_1$ is selected within the range of $V_{inDC}$ to $V_{inDC} + V_{30off}$ ($V_{inDC} < V_1 < V_{inDC} + V_{30off}$). Accordingly, the voltage $V_{30on}$ is given by:

$$V_{30on} = V_1 - V_{inDC}. \quad (8)$$

As apparent from Equations (7) and (8), the base potential difference, namely, the threshold voltage of the differential transistor circuit can be changed in response to the field strength by providing the input terminal 13' with the output signal of the AGC circuit. Accordingly, the P/A ratio can be automatically changed with a variation in the threshold voltage of the pulse generating circuit 58.

Figure 8:
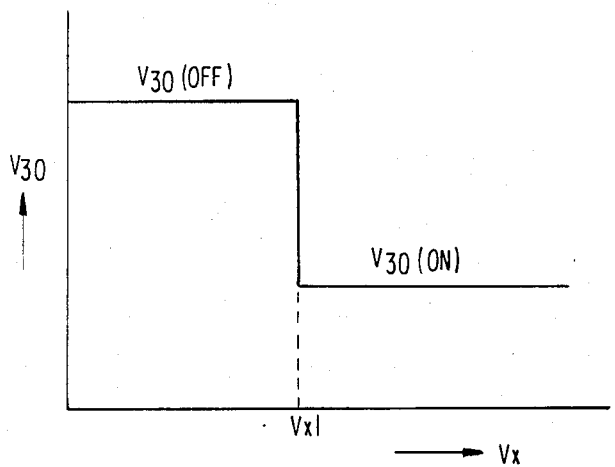
FIG. 8 is an input average voltage versus threshold voltage characteristic of a differential transistor circuit used in the circuit arrangement depicted in FIG. 7.

Referring to FIG. 8, the transistor 83 is rendered conductive when the average voltage $V_x$ of the input signal introduced into the input terminal 13' exceeds the predetermined voltage $V_{x1}$.

The circuit arrangement according to the second embodiment of this invention is suitable for the noise reducing unit. The noise reducing unit can achieve an excellent pulse noise reducing ability by automatically changing the P/A ratio in response to the field strength. In particular, such a noise reducing unit is suitable for the pulse noise reducing unit in the radio receiver for an automobile wherein there are large changes in field strength.

The voltage $V_{30on}$ may be varied by controlling the reference voltage $V_1$. However, the voltage $V_{30off}$ is determined by the resistance value of the resistor 30 and the current $I_3$, and hence it cannot be changed. Therefore, a variable resistor may be used for the constant current source 75 in accordance with the teaching of the circuit shown in FIG. 3. By this modification, the threshold voltage of the circuit shown in FIG. 7 can be regulated, and further changed in response to the electrical field strength.

As thus far been described, the circuit arrangement according to this invention is capable of voluntarily adjusting the threshold voltage of the differential transistor circuit in compliance with requests and is suitable for various uses and suitable for circuit integration.

What is claimed is:

1. A circuit arrangement comprising a differential amplifier having first and second input terminals, input signal supplying means for supplying said first input terminal with an input signal;

a first current circuit having a first reference current terminal and first and second current terminals for producing a first reference current and first and second current through said first reference terminal and said first and second current terminals, respectively, each of said first and second currents being related to said first reference current;

a second current circuit having a third current terminal and a second current reference terminal connected to said second current terminal for causing a third current and said second current to flow through said third current terminal and said second current reference terminal, respectively, said third current being dependent on said second current and substantially equal to said first current;

a resistor connected between said first current terminal and said third current terminal for producing a comparison voltage; and means for coupling one end of said resistor to said second input terminal of said differential amplifier to supply said comparison voltage to said second input terminal.

2. A circuit arrangement as claimed in claim 1, further comprising:

a reference voltage circuit connected to said input signal supplying means and to the other end of said resistor for keeping said other end at a DC potential that is substantially equal to the DC potential at said first input terminal.

3. A circuit arrangement as claimed in claim 2, further comprising:

a variable resistor connected to said first current reference terminal for varying said first reference current to change said first and said second currents.

4. A circuit arrangement as claimed in claim 1, wherein said first current circuit comprises:

a first transistor having a first emitter, a first base, and a pair of first collectors, said first collectors being connected to said first and second current terminals, respectively; and a second transistor having a second emitter, a second base connected to said first base, and a second collector which is connected to said first current reference terminal and which is also connected in common to said second base to be operated as a diode;

said first and said second emitters being supplied with a power source voltage.

5. A circuit arrangement as claimed in claim 4, further comprising:

an additional differential amplifier having a first additional input terminal connected to said one end of said resistor, a second additional input terminal supplied with a reference voltage and an output terminal connected to said first emitter; and activating means coupled to said additional differential amplifier for selectively putting said additional differential amplifier into a non-activated state and an activated state to control said first current produced from said first transistor and, thereby, to change said comparison voltage in said non-activated and said activated state.

6. A circuit arrangement as claimed in claim 5, wherein said activating means activates said additional differential amplifier by supplying an operating current to said additional differential amplifier when an average voltage of said input signal becomes larger than a predetermined value.

7. A circuit arrangement as claimed in claim 6, wherein said activating means includes:
   a third transistor for generating said operating current when said third transistor is rendered conductive; and
   a fourth transistor for rendering said third transistor conductive when the average voltage of said input signal becomes larger than the predetermined value.

8. An electronic circuit comprising means responsive to a gate signal for interrupting an input signal, means responsive to said input signal for detecting a noise signal accompanying said input signal, means for producing a reference voltage having a first level, means for comparing an output of said detecting means with said reference voltage to generate said gate signal, means for detecting a strength of said input signal to produce a detection signal when the strength of said input signal takes a predetermined value, and means responsive to said detection signal for changing said reference voltage from said first level to a second level.

9. An electronic circuit as claimed in claim 8, wherein said reference voltage producing means comprises a first current mirror circuit having a first input terminal supplied with a reference current and first and second output terminals, each producing an output current relative to said reference current, a second current mirror circuit having a second input terminal coupled to said first output terminal and a third output terminal, and a resistor coupled between said second and third output terminals, said reference voltage being produced at one end of said resistor, and said changing means comprising a differential amplifier having a first input end supplied with said second level, a second input end coupled to said one end of said resistor and an output end coupled to said first current mirror circuit, and an activating circuit activating said differential amplifier in response to said detection signal.

10. A noise reduction system for an input signal whose level varies in accordance with an electrical field strength, comprising means responsive to said input signal for producing a first signal which comprises high frequency components of said input signal, means responsive to said first signal for detecting said electrical field strength to produce a second signal when said electrical field strength takes a predetermined value, means for generating a reference voltage having a first level when said second signal is not produced and a second level when said second signal is produced, means for comparing said first signal with said reference voltage to detect pulse noises accompanying said input signal, means responsive to the detected pulse noises for creating gate signals, and means responsive to said gate signals for interrupting said input signal.

11. The noise reduction system as claimed in claim 10, said reference voltage generating means comprising a current circuit responding to a first current and producing a second current relative to said first current, a resistor supplied with said second current to generate the reference voltage having said first level, and means responsive to said second signal for changing said second current to a third current to vary the voltage across said resistor from said first level to said second level.

* * * * *